United States Patent [19]
McDonough et al.

[11] Patent Number: 5,902,437
[45] Date of Patent: May 11, 1999

[54] METHOD OF MAKING RESONANT TAG LABELS

[75] Inventors: Neil McDonough; John R. Pennace, both of Paxton, Mass.

[73] Assignee: FLEXcon Company Inc., Spencer, Mass.

[21] Appl. No.: 08/610,158

[22] Filed: Feb. 29, 1996

Related U.S. Application Data

[60] Division of application No. 08/381,086, Jan. 31, 1995, Pat. No. 5,751,256, which is a continuation-in-part of application No. 08/206,865, Mar. 4, 1994, abandoned.

[51] Int. Cl.$^6$ .............................. B32B 31/00; B44C 1/16; H01Q 1/36

[52] U.S. Cl. ......................... 156/234; 156/239; 156/241; 156/289; 427/146; 427/152; 340/572; 343/873

[58] Field of Search ................................ 156/233, 234, 156/239, 241, 289; 340/572; 343/873, 895; 427/146, 147, 152

[56] References Cited

U.S. PATENT DOCUMENTS

| | | |
|---|---|---|
| 3,785,895 | 1/1974 | Ettre et al. . |
| 3,913,219 | 10/1975 | Lichtblau . |
| 4,012,552 | 3/1977 | Watts . |
| 4,091,125 | 5/1978 | Delgadillo . |
| 4,330,352 | 5/1982 | Grimes et al. . |
| 4,342,904 | 8/1982 | Onsager . |
| 4,349,402 | 9/1982 | Parker . |
| 4,369,557 | 1/1983 | Vandebult . |
| 4,483,732 | 11/1984 | Penta et al. . |
| 4,495,232 | 1/1985 | Bauser et al. ........................ 156/233 X |
| 4,511,616 | 4/1985 | Pitts et al. . |
| 4,555,414 | 11/1985 | Hoover et al. . |
| 4,560,445 | 12/1985 | Hoover et al. . |
| 4,581,524 | 4/1986 | Hoekman et al. . |
| 4,583,099 | 4/1986 | Reilly et al. . |
| 4,586,976 | 5/1986 | Takano et al. .......................... 156/233 |
| 4,591,527 | 5/1986 | Czichy . |
| 4,598,276 | 7/1986 | Tait . |
| 4,666,735 | 5/1987 | Hoover et al. . |
| 4,673,923 | 6/1987 | Boscoe et al. . |
| 4,682,154 | 7/1987 | Fearon et al. . |
| 4,717,438 | 1/1988 | Benge et al. . |
| 4,720,315 | 1/1988 | Greenman . |
| 4,721,638 | 1/1988 | Matsuguchi et al. . |
| 4,746,556 | 5/1988 | Matsuguchi et al. . |
| 4,778,552 | 10/1988 | Benge et al. . |
| 4,783,646 | 11/1988 | Matsuzaki . |
| 4,792,790 | 12/1988 | Reeb . |
| 4,797,785 | 1/1989 | Jorgensen . |
| 4,816,321 | 3/1989 | Pickering . |

(List continued on next page.)

FOREIGN PATENT DOCUMENTS

| | | |
|---|---|---|
| 0 485 176 | 5/1992 | European Pat. Off. . |
| 1-113764 | of 0000 | Japan . |
| 4-42680 | of 0000 | Japan . |
| 5-501320 | of 0000 | Japan . |
| 5-75890 | of 0000 | Japan . |
| 63-279399 | of 0000 | Japan . |
| 63-55695 | of 0000 | Japan . |
| WO 92/21113 | 11/1992 | WIPO . |

OTHER PUBLICATIONS

"Circuits are applied directly to electronic packages", News Trends, Feb. 7, 1985, p. 12, Machine Design.

*Primary Examiner*—Curtis Mayes
*Attorney, Agent, or Firm*—Samuels, Gauthier & Stevens

[57] ABSTRACT

A frangible label which includes a plurality of integrally joined layers deposited successively on a removable carrier film. One or more of the layers are electrically conductive and configured to define an electrical circuit. The label is transferrable from the carrier film onto a receiving surface and is otherwise inseparable from the carrier film without attendant disruption of the circuit. In an alternative embodiments the label includes an adhesive layer for applying the label to a substrate, such that the plurality of integrally joined layers including the electrical circuit are transferrable to the receiving surface and are otherwise inseparable from the carrier film without destruction of the electrical circuit.

26 Claims, 6 Drawing Sheets

U.S. PATENT DOCUMENTS

| | | |
|---|---|---|
| 4,816,322 | 3/1989 | Pickering . |
| 4,843,404 | 6/1989 | Benge et al. . |
| 4,846,922 | 7/1989 | Benge et al. . |
| 4,849,736 | 7/1989 | Cordery . |
| 4,859,263 | 8/1989 | Dziurla et al. ............... 156/233 X |
| 4,864,280 | 9/1989 | van der Meij . |
| 4,868,049 | 9/1989 | Nelson . |
| 4,869,767 | 9/1989 | Robinson et al. ............... 156/233 |
| 4,876,555 | 10/1989 | Jorgensen . |
| 4,889,573 | 12/1989 | Stein et al. .................. 156/233 X |
| 4,900,386 | 2/1990 | Richter-Jörgensen . |
| 4,902,364 | 2/1990 | Parker et al. . |
| 4,902,546 | 2/1990 | White . |
| 4,935,093 | 6/1990 | Reeb . |
| 4,960,651 | 10/1990 | Pettigrew et al. . |
| 4,970,495 | 11/1990 | Matsumoto et al. . |
| 4,985,288 | 1/1991 | Matsumoto et al. . |
| 4,988,550 | 1/1991 | Keyser et al. . |
| 5,006,856 | 4/1991 | Benge et al. . |
| 5,010,320 | 4/1991 | Cordery . |
| 5,012,225 | 4/1991 | Gill . |
| 5,059,950 | 10/1991 | Perchak . |
| 5,083,112 | 1/1992 | Piotrowski et al. . |
| 5,087,495 | 2/1992 | Nelson . |
| 5,108,822 | 4/1992 | Imaichi et al. . |
| 5,119,070 | 6/1992 | Matsumoto et al. ............... 340/572 |
| 5,130,697 | 7/1992 | McGinn . |
| 5,142,270 | 8/1992 | Appalucci et al. . |
| 5,181,020 | 1/1993 | Furukawa et al. . |
| 5,184,111 | 2/1993 | Pichl . |
| 5,214,410 | 5/1993 | Verster . |
| 5,241,299 | 8/1993 | Appalucci et al. . |
| 5,285,191 | 2/1994 | Reeb ............................. 340/572 |
| 5,391,247 | 2/1995 | Kamen et al. . |
| 5,405,702 | 4/1995 | Piotrowski et al. . |
| 5,442,334 | 8/1995 | Gallo et al. . |
| 5,464,690 | 11/1995 | Boswell . |
| 5,494,550 | 2/1996 | Benge . |
| 5,528,222 | 6/1996 | Moskowitz et al. . |
| 5,568,125 | 10/1996 | Liu . |
| 5,574,470 | 11/1996 | de Vall . |
| 5,580,664 | 12/1996 | Tsai ............................. 340/572 X |
| 5,589,251 | 12/1996 | Imaichi et al. . |
| 5,602,527 | 2/1997 | Suenaga . |
| 5,603,259 | 2/1997 | Gross et al. . |
| 5,604,485 | 2/1997 | Lauro et al. ................... 340/572 |
| 5,605,768 | 2/1997 | Furukawa et al. . |
| 5,608,417 | 3/1997 | de Vall . |
| 5,645,932 | 7/1997 | Uchibori . |
| 5,674,580 | 10/1997 | Boswell . |
| 5,683,774 | 11/1997 | Faykish et al. . |

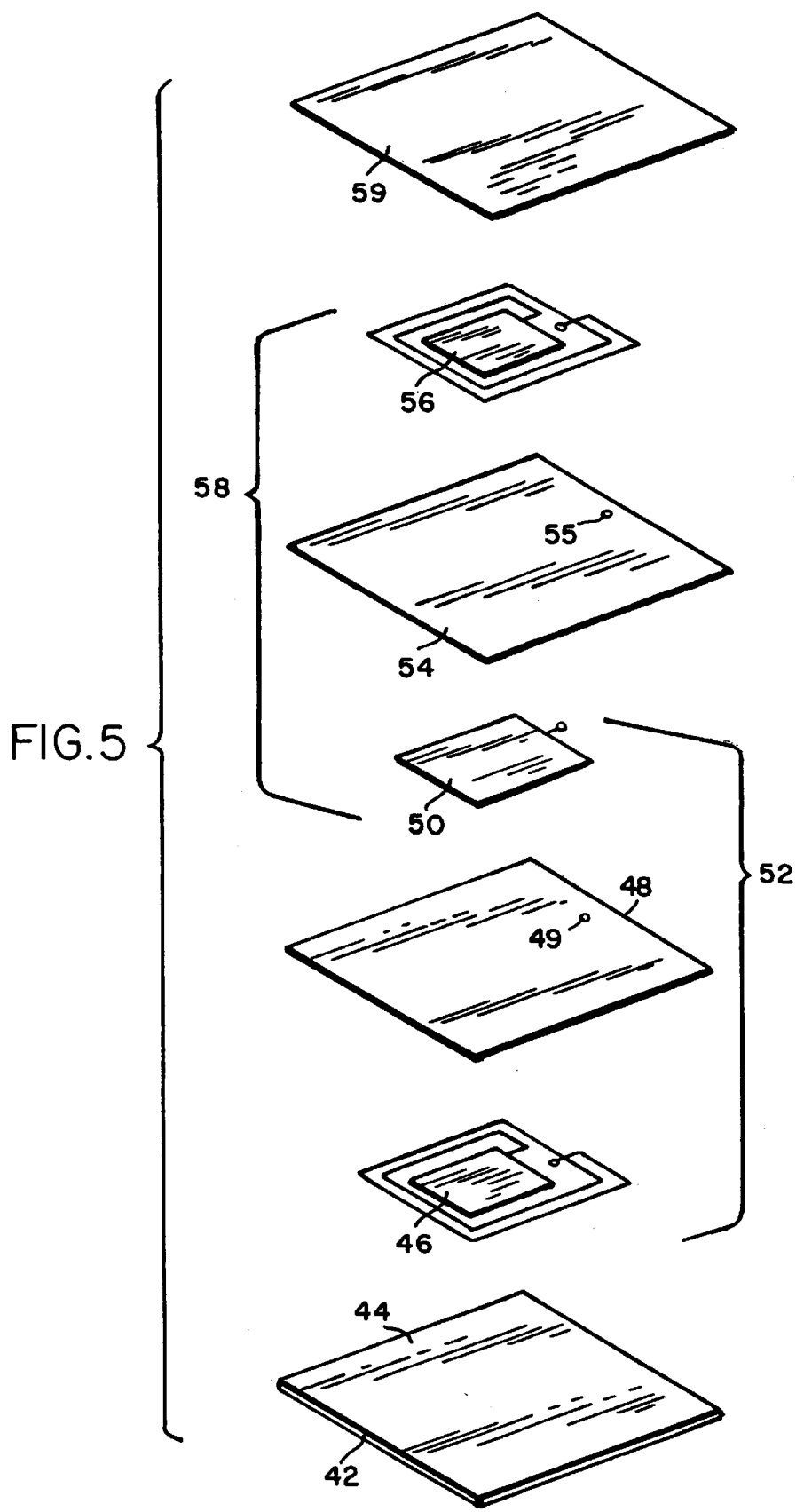

METHOD OF MAKING RESONANT TAG LABELS

This application is a divisional of application Ser. No. 08/381,086 filed on Jan. 31, 1995, now U.S. Pat. No. 5,751,256, which is a continuation-in-part of Ser. No. 08/206,865 filed on Mar. 4, 1994, now abandoned.

BACKGROUND OF THE INVENTION

The invention relates to resonant tag labels which are used in electronic article surveillance and identification systems.

Conventional electronic article surveillance systems are utilized widely as an effective deterrent to unauthorized removal of items from specified surveillance areas. In surveillance systems of this type, articles to be monitored are provided with resonant tag labels which are used to detect the presence of the articles as they pass through a surveillance zone. The surveillance zone typically comprises an electromagnetic field of a predetermined frequency generated in a controlled area. The tag label resonates at the frequency of the electromagnetic field or another predetermined frequency. The resonant frequency is detected by the system and provides an alarm indicating the presence of the label and, therefore, the article. For deactivation, a strong surge current is induced in the resonant tag label in order to produce a short-circuit.

Presently available resonant tag labels include conductive layers separated by a dielectric layer. Specifically, such labels include circuits having a dielectric carrier film with an inductive spiral applied to one side thereof, such as an appropriately configured metal foil, which is terminated at each end by first and second conductive areas. Hatching conductive areas are applied to the opposite side of the dielectric carrier film to form a capacitor, thus completing an inductive-capacitive tuned resonant circuit. The circuits may also be configured such that a direct electrical connection is provided between the conductive areas on both sides of the dielectric film.

Label thickness is increased significantly by the reliance on relatively thick films as the dielectric medium for physically separating and supporting the conductive components of the circuit. Thickness is further increased by the application of additional films or coatings to protect and stabilize the label. The resulting overall thickness of the labels makes it difficult if not impossible to effectively conceal them from detection and unauthorized removal by those determined to foil the surveillance system.

With respect to identification systems conventional methods typically involve automatic reading of bar codes (UPC) provided on indicia receptive labels. Unfortunately, a disadvantage in bar code systems includes the need for the article to which the label is applied and the bar code itself to be oriented such that the reading or detection beam can properly read the bar coded information. This problem can be serious if the objects being identified are to be sorted and the objects are random as to delineation and orientation.

It is therefore an object of the present invention to provide a resonant tag label which is constructed with thin coatings so that the tag label may be disguised, for example, underlying a conventional printed label.

It is a further object of the present invention to provide a resonant tag label and method for making same which utilizes a minimum of components and which is separable from an initial film used primarily during the configuration of the tag label.

It is yet another object of the present invention to provide a resonant tag label which is responsive to a plurality of frequencies.

It is an additional object of the present invention to provide a resonant tag label which provides proper electronic identification information regardless of the orientation of the label.

It is yet another object of the present invention to provide a thin, frangible resonant tag label which in essence requires a substrate film or a substrate object to which it is applied in order to remain a viable construction.

SUMMARY OF THE INVENTION

Accordingly, the present invention provides a frangible label which includes a plurality of integrally joined layers deposited successively on a removable carrier film. One or more of the layers are electrically conductive and configured to define an electrical circuit. The label is transferrable from the carrier film onto a receiving surface and is otherwise inseparable from the carrier film without attendant disruption of the circuit. In an alternative embodiment, the label includes an adhesive layer for applying the label to a receiving surface, such that the plurality of integrally joined layers including the electrical circuit are transferrable to the receiving surface and are otherwise inseparable from the carrier film without destruction of the electrical circuit.

Through proper choice of conductive materials, dielectric coatings and adhesive, the resonant tag labels of the present invention can be designed such that a source tag package could be easily recyclable. This is not the case with conventional labels which employ films such as polyethylene and conductive layers such as aluminum foil. The mixture of film and foils together with the other packaging material makes any attempt to recycle the package much more difficult. In addition, the easily transferable circuits of the present invention are able to be positioned either in combination with an existing label or other parts of an existing package in such a manner as to not obstruct vital information on the package or severely alter the aesthetics of the package. Given the costs and the environmental restraints on packaging, alteration of the aesthetics is not a trivial issue. Furthermore, the present invention has the advantage of easy concealability due to the thin membrane construction, and furthermore, allows for incorporation in deformable packages or containers.

In accordance with an alternative embodiment of the present invention, there is provided a resonant tag label and method of making same including a first electrically conductive pattern applied to a first dielectric layer, a dielectric coating which is adhered to at least the first electrically conductive pattern, a second electrically conductive antenna pattern adhered to the dielectric coating, and a second dielectric layer which is applied to at least the second electrically conductive pattern. According to one embodiment of the invention, the first dielectric layer is a separable carrier film and the second dielectric layer is an adhesive layer. The adhesive is applicable to a substrate and has a peel strength greater than that required to separate the carrier film from the rest of the label structure.

According to another embodiment of the invention, a third electrically conductive pattern is adhered to the second dielectric layer such that the second and third electrically conductive patterns form a second frequency tuned antenna circuit. In a further aspect, additional electrically conductive patterns and dielectric coatings, respectively, are alternately adhered to the second dielectric layer in a stacked construction so as to form a plurality of additional frequency tuned antenna circuits.

In another embodiment, similarly structured antenna circuits are constructed on portions of the first dielectric layer proximate to the first frequency tuned antenna circuit in a planar construction so as to form additional frequency tuned antenna circuits.

BRIEF DESCRIPTION OF THE DRAWINGS

FIG. 5 shows a perspective view of an alternative embodiment of the resonant tag label in accordance with the present invention in which antenna circuits are provided in a stacked construction;

DETAILED DESCRIPTION OF THE ILLUSTRATED EMBODIMENTS

Figure 1:
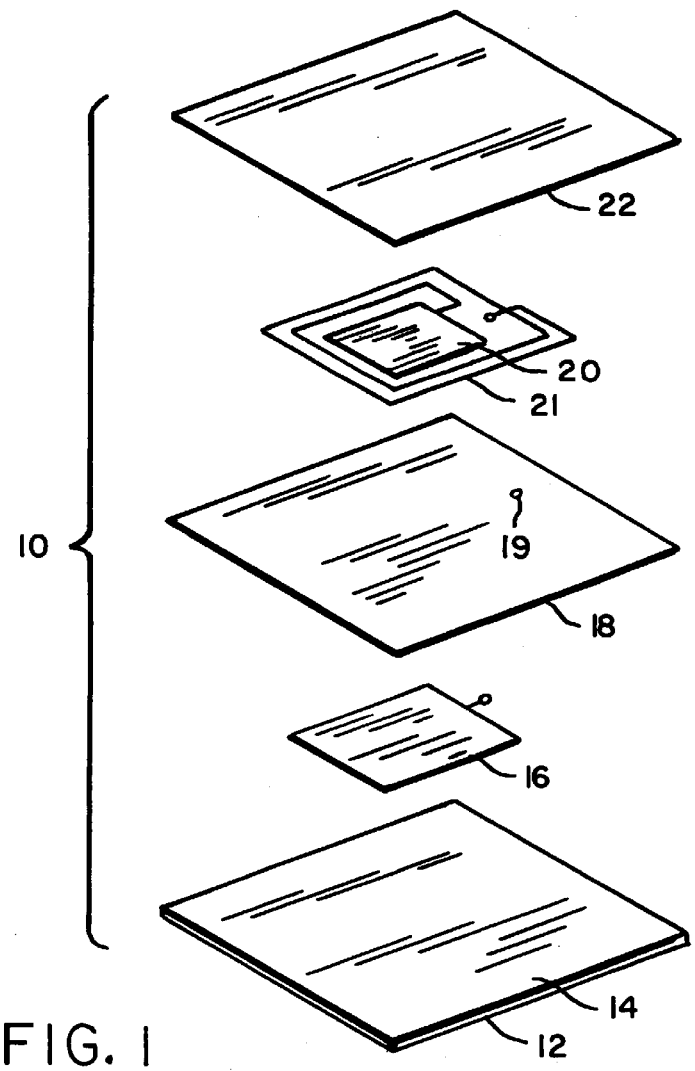
FIG. 1 shows a perspective exploded view of a resonant tag label in accordance with the present invention.
Figure 2:
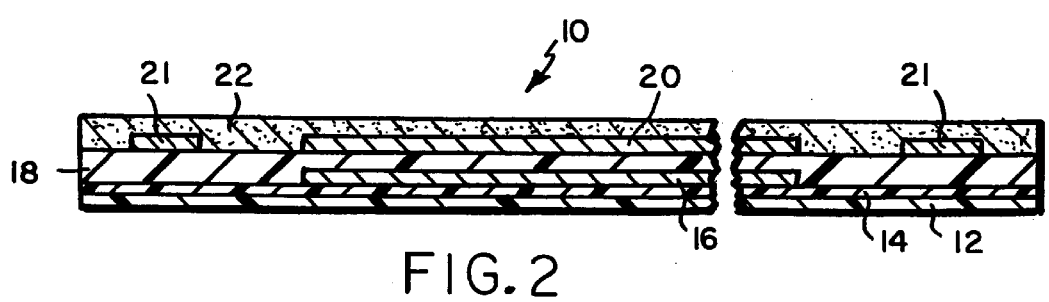
FIG. 2 shows a cross-sectional view of a portion of the resonant tag label in which the antenna patterns on opposite sides of the dielectric layer are inductively coupled to one another.

With reference now to the drawings, where the thickness dimensions of label components have been exaggerated for purposes of illustration, one embodiment of a resonant tag label 10 in accordance with the present invention is disclosed in FIGS. 1 and 2. Initially, there is provided a carrier film 12 which serves as a stable base for the label structure. For exemplary purposes, the carrier film may be any one of the following: polypropylene with a preferred thickness of 2.0 mils, polyester with a preferred thickness of 0.50 to 1.5 mils, polyethylene with a preferred thickness of 2.5 mils, PVC with a preferred thickness between 2.0 to 5.0 mils, or conventional paper with preferred thickness of 1.4 to 6 mils. As will be described in more detail hereinafter, the carrier film either remains as part of the label structure and is configured to receive indicia, or as in the preferred embodiment, the carrier film is removed during adhesive application of the label to a substrate.

The carrier film 12 includes a surface on which the label structure is constructed. Preferably, the carrier film surface is configured as a low surface energy film, such as polypropylene, where the intrinsic surface tension of the film makes it a releasable or low adhesion surface. Alternatively, the film 12 is provided with a break or release coating on breakcoat 14. The specific applications of the resonant tag label, as well as the type of underlying carrier film, typically determines which type of breakcoat can be utilized. An example of such an application would be in a situation where the thermal transfer requirement is such that the breakcoat or transfer resin should not melt while the temperatures are high enough to soften heat reactivated adhesives being employed to adhere the label to a substrate. Such a situation would limit the type of resins utilized. In addition, if a polyester carrier film is used, it is possible that a release coat on the polyester side against the transfer coat may be required. Similar examples which will determine the breakcoat include the need for enhanced moisture vapor barrier properties, and other environmental/product resistance requirements. Furthermore, it will be appreciated that the film 12 need not have a releasable surface, break coating, etc., thus accommodating permanent application of the subsequent layers added to the film.

The release coatings which are preferred to be used are silicones, either pure or silicone modified acrylics. An alternative would be to supply a true breakcoat, i.e. a coating designed to have a preferential adhesion strength to the layers developed thereon which are transferred.

The aforementioned carrier film 12 and optional breakcoating are preferably both flexible. Thus, the components will be useful in fabrication of the resonant tag label 10, enabling a series of labels to be fabricated with a continuous web process, as is well known in the art.

A first electrically conductive pattern 16, e.g. a plate, is applied to the carrier film surface or its breakcoat 14. The pattern 16 is produced by a selective metallization process, preferably by registered deposition of a conductive material at specific locations within the format of the label. For example, application of conductive inks or electrodeless metallic deposition. Conductive ink coatings result in the range of 0.05 to 0.5 mil, while electrodeless depositions range from 0.001 to 0.1 mil. It will be appreciated by those of skill in the art that any of the conductive patterns described herein can be metallic or conductive non-metals, such as carbon or silicon based conductors.

Another exemplary process for applying the conductive pattern is by vacuum deposition of metals such as aluminum or silver, which is carried out in conjunction with a continuous mask band having register holes that allow the vaporized metal to pass through and condense on the web of carrier film. An alternative method of creating the conductive pattern includes the metallization of the entire carrier film surface area, and a subsequent subjection of the carrier film to a selective demetallization process to achieve the desired pattern. It will be appreciated that vacuum metallized deposits are on the order of $3.0 \times 10^{-4}$ mil to $6.0 \times 10^{-3}$ mil, or approximately 75 to 1500 Å, in thickness.

A further method of producing a conductive pattern involves applying a continuous conductive layer, and thereafter chemically etching, laser cutting or arc cutting the desired pattern. The continuous conductive layer is derived from vacuum metallization deposits, sputter depositions (25 to 1200 Å), plasma depositions (50 to 10,000 Å), or conventional metallic transferring techniques.

A dielectric coating 18 is next applied to at least the first conductive pattern 16. The dielectric coating 18 can overlap the conductive pattern onto the carrier film 12 depending on the desired overall size of the resonant tag label 10. A preferred method of providing the dielectric coating is a selective printing of the dielectric material onto specified areas. The dielectric material can consist of any number of conventionally available polymeric materials, such as acrylics, polyester, polyurethanes, silicones, etc. The preferred range of thickness for this coating is 0.025 to 1.2 mils.

A second conductive pattern, which includes a conductor plate 20 and a spiral antenna pattern 21, is applied to the dielectric coating. The conductive patterns 16 and 20 together with the spiral antenna pattern 21 form an inductive tuned capacitance circuit which resonates at a desired frequency. The conductor 20 and spiral pattern 21 are produced on the dielectric coating 18 in accordance with similar processes as described with respect to the first conductor 16. The first and second conductors are inductively coupled through the dielectric coating 18.

Figure 3:
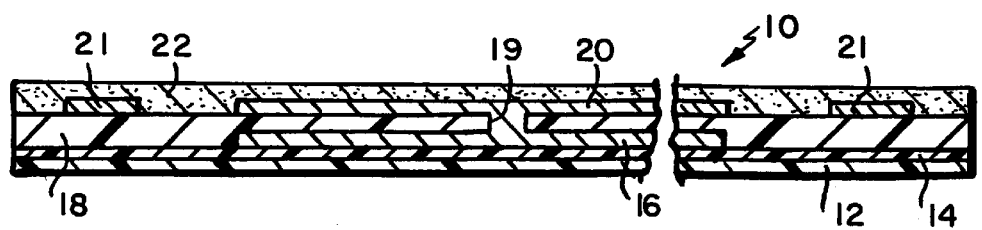
FIG. 3 shows a cross-sectional view of the resonant tag label in which the antenna patterns are in direct electrical contact with one another.

According to an alternative embodiment of the present invention, as depicted in FIG. 3 the dielectric 18 is configured with a gap or through-hole 19, which accommodates direct electrical contact between the conductors 16, 20.

Figure 4:
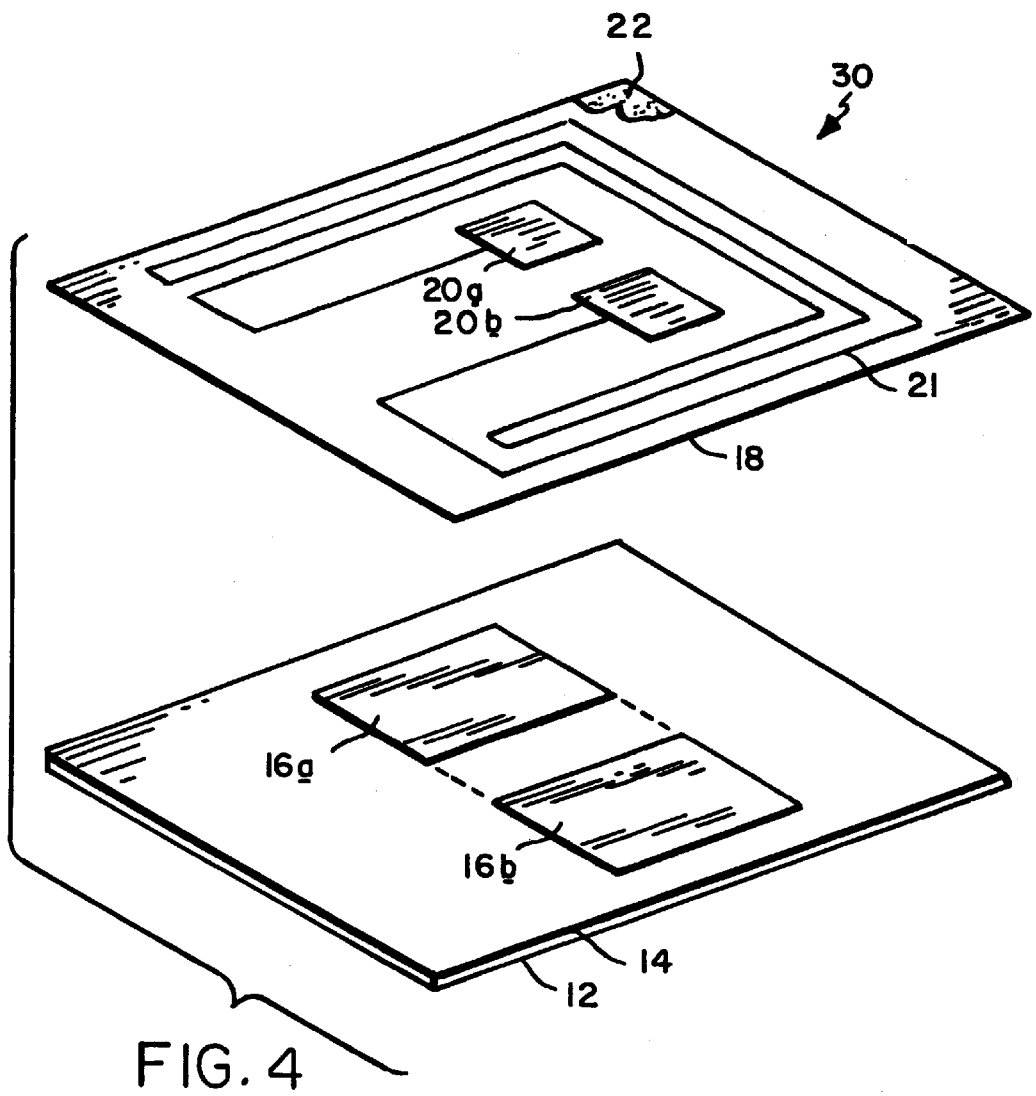
FIG. 4 shows a perspective view of an alternative embodiment of the resonant tag label in accordance with the present invention.

With reference now to FIG. 4, an alternative embodiment of the resonant tag label 30 is shown as including a carrier film 12 and breakcoat 14 having two conductive plates 16a, 16b, or a continuous single conductor, applied thereto. The dielectric coating 18 is then applied to at least the conductive plates 16a, 16b, and on the opposite side thereof, a conductive pattern which includes conductive plates 20a, 20b and spiral antenna pattern 21 is applied to create an inductive capacitance circuit. This configuration is an alternative method to create the proper capacitance to deliver the desired resonant frequency.

Referring back now to FIGS. 1–3, an adhesive layer 22 is applied to at least the second conductive antenna pattern. The adhesive layer is a conventional pressure sensitive or heat activated adhesive layer having a preferred thickness of 0.1 to 1.0 mil. The adhesive is utilized to bond the resonant tag label 10 to the particular substrate (not shown) to which the label is to be attached. A dielectric coating can also be applied alone or in conjunction with the adhesive layer 22, which in effect also serves as a dielectric.

It will be appreciated by those of skill in the art that an alternative form of the above described resonant tag label may be constructed by initially beginning with a dielectric coating rather than the carrier film 12, which in effect also serves as a dielectric. Instead, the carrier film is applied to the top of adhesive layer 22 to accommodate a construction wherein a transfer to the underside of an adhesive label could be made allowing for the adhesive layer 22 to be situated proximate to the adhesive on the label stock. In addition, the antenna circuit could also be constructed on the label stock itself.

The resonant tag label 10 described heretofore may subjected to plasma depositions of glass such that the conductive patterns and dielectric coating are enveloped by a glass layer in order to improve the dielectric strength and/or the overall environmental resistance of the label. In these situations, the glass coatings can be applied on top of the breakcoat so as to be under the first conductive pattern and on top of the second conductive pattern prior to the application of the adhesive layer 22. The glass coatings can be in the range of 60 to 5000 Å.

In operation, the resonant tag label 10 is applied to a selected substrate with the adhesive system 22. Thereafter, the carrier film 12 and breakcoat 14 are removed from the thus applied label structure. The adhesive system 22 preferably has a peel strength greater than that required to separate the carrier film from the label structure. Accordingly, the resonant tag label 10 as used on a substrate does not include a film as a part of the label structure. Instead, it is a combination of thin conductive and dielectric coatings as described heretofore. The only role the carrier film has in the label structure is to provide the initial support for the label components prior to application of the label to a selected substrate.

The total thickness of the resonant tag label in use is a fraction of that found in conventional resonant tag labels. The present invention is preferably of a thickness between 0.05 mil ($5.0 \times 10^{-4}$ inches) to 1.2 mils ($1.2 \times 10^{-3}$ inches), excluding adhesive, which allows the label to be readily applied to various types of substrates. Thus, the label can also be more easily hidden behind other graphic type labels. Furthermore, the thin, frangible nature of the resonant tag label of the present invention provides tamper evidence in the event that it is removed from a substrate to which it has been adhered. One of the advantages of using the above described thin layer construction is that each layer can be precisely registered to each other and to specific positions on the film, thus allowing for the spacing needed for subsequent, or prior, layers in the label structure.

An additional but less preferable alternative embodiment of the present invention includes the use of the carrier film 12 as a permanent part of the resonant tag label 10 construction. In order to accomplish this, the surface 14 or the optional breakcoat is replaced by an adhesion coat or other surface treatment or preparation. In this constructions the outside surface of the carrier film 12 may be utilized as a label face to receive indicia, and to further serve to disguise the underlying circuitry.

Another alternative embodiment of a resonant tag label according to the present invention is illustrated in FIG. 5, showing a first antenna pattern 46 applied to the surface 44 of a carrier film 42. It will be appreciated that the carrier film may include a dielectric coating by itself or in conjunction with the carrier film. Subsequent layers including a first dielectric coating 48 with through-hole 49 and a conductive plate 50 are applied to the first antenna pattern 46 to form a first tuned antenna circuit 52 with a first predetermined frequency. Thereafter, consecutive layers of a second dielectric coating 54 with through-hole 55 and a second antenna pattern 56 are applied onto the conductive plate 50 to form a second tuned antenna circuit 58 with a second predetermined frequency. A final adhesive coating 59 is applied to the thus constructed label.

Accordingly, the resonant tag label of FIG. 5 is operational with respect to two different frequencies. As a further aspect of this embodiment, additional alternate layers of conductive plates and antenna patterns with a dielectric coating therebetween may be applied to the label structure, thus rendering the resonant tag label operational with respect to a plurality of frequencies. It will be appreciated that the tuned frequencies may be altered by varying the size and/or thickness of any one of the conductive patterns or dielectric layers.

Figure 6:
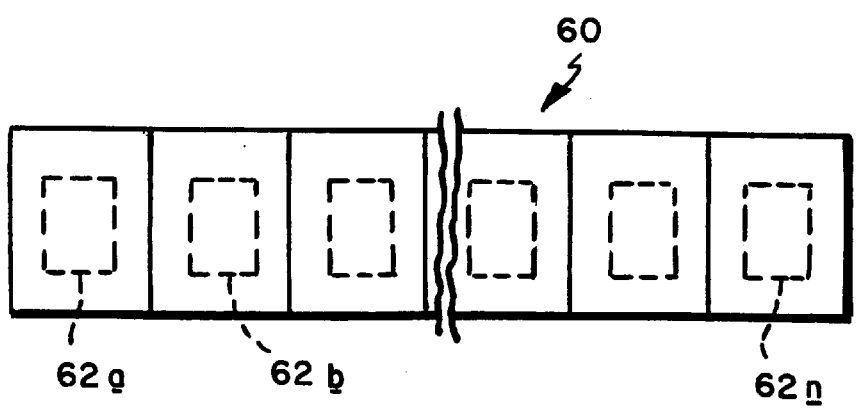
FIG. 6 shows a plane view of an alternative embodiment of the resonant tag label in accordance with the present invention in which antenna circuits are provided in an adjacently disposed planar construction.

With reference to FIG. 6, a further embodiment of the resonant tag label 60 is shown. The label 60 is constructed in a planar manner, for example in a row as illustrated, to include adjacently disposed tuned antenna circuits 62a, 62b, through 62n. Each of these antenna circuits may be produced in accordance with the label construction disclosed for example in FIGS. 1 and 2. The planar construction of label 60 provides a less expensive process for producing a resonant tag label which is responsive to a plurality of frequencies as compared to the stacked construction of label 40 illustrated in FIG. 5. Alternatively, the adjacently configured construction or the stacked construction can operate to be stimulated by a single frequency and transmit a plurality of possibly differing frequencies.

Both the resonant tag labels 40 and 60 have operational applications in identification and surveillance systems. For example, a resonant tag label can be constructed with ten different frequency tuned antennas for exposure to a multiple frequency generation source, ideally having ten frequencies corresponding to each of the ten antennas. In operation, predetermined ones of the antennas are selectively deactivated either during construction (e.g, selective demetallization, etc.) or prior to application (e.g. destructive frequency field, mechanical interference, etc.)

For a resonant tag label with ten antenna circuits, there are 1023 discrete combinations of tuned antenna responses when ignoring the combination where all of the circuits are deactivated yielding no response. Accordingly, for N antenna circuits, there are $2^N-1$ discrete operational responses. The operation of this type of label structure is suitable, for example, in sorting processes in which the object carrying the label is randomly oriented. Unlike bar codes (UPC), the resonant tag labels in accordance with the present invention operate to provide frequency responses independent of orientation.

Figure 7:
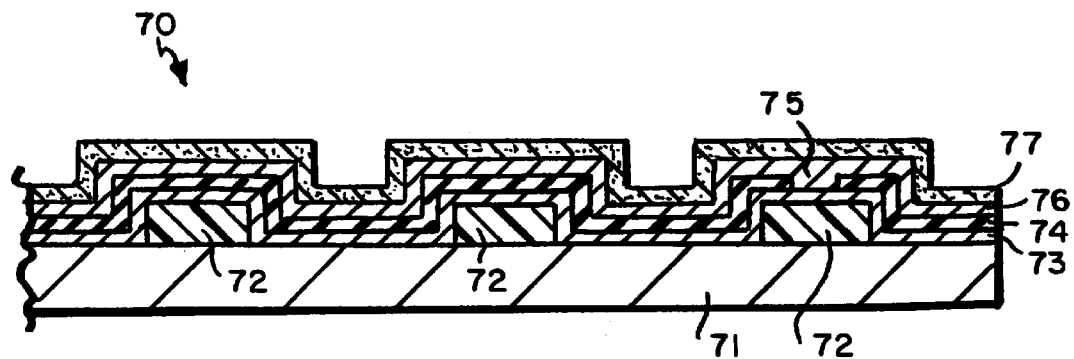
FIGS. 7–11 show cross-sectional views of alternative embodiments of the resonant tag label in accordance with the present invention.

With reference now to FIG. 7, another alternative embodiment of a thin transferrable resonant tag label 70 in accordance with the present invention is shown. The resonant tag label 70 includes a carrier film 71 with a patterned breakcoating 72 applied to one surface thereof. A first electrically conductive layer 73 is then applied over the entire surface of the film 71 and the breakcoat pattern 72. The conductive layer 73, for example, is formed from any conventional coating technique as described heretofore. A dielectric coating 74 is thereafter applied to the conductive layer 73, in a manner such that a gap or hole 75 is registered to a predetermined portion of the conductive layer 73. A second electrically conductive layer 76 is applied over the entire dielectric coating including the area registered with the hole 75. Accordingly, the hole accommodates contact between the first and second electrically conductive layers, thus forming the configuration of the resonant circuit. Finally, an adhesive layer 77 is applied to overlie the second conductive layer 76

The adhesive layer alternatively may be applied in a registered manner so as to only overlie those portions of the label 70 constructed on top of the patterned breakcoating 72. In either construction, the circuitry of the resonant tag label 70 is formed by affixing the adhesive layer 77 to the desired receiving surface and thereafter removing the carrier film. Those areas overlying the patterned breakcoating will be the only areas which transfer to the receiving surface due to the fact that in the preferred embodiment, the adhesive has a peel strength greater than that required to separate the carrier film from the breakcoating but less than that required to separate the carrier film from the conductive layer 73. Thus, those label portions not overlying the breakcoating are ripped away from the receiving surface as they are not released from the carrier film 71.

Accordingly the resonant tag label 70 is of a frangible construction and includes at least two conductive layers which are disrupted and configured to define an electrical circuit during removal of the carrier film. The label is transferrable from the carrier film onto a receiving surface and is otherwise inseparable from the carrier film without attendant disruption and destruction of the resonant tag circuit.

Figure 8:
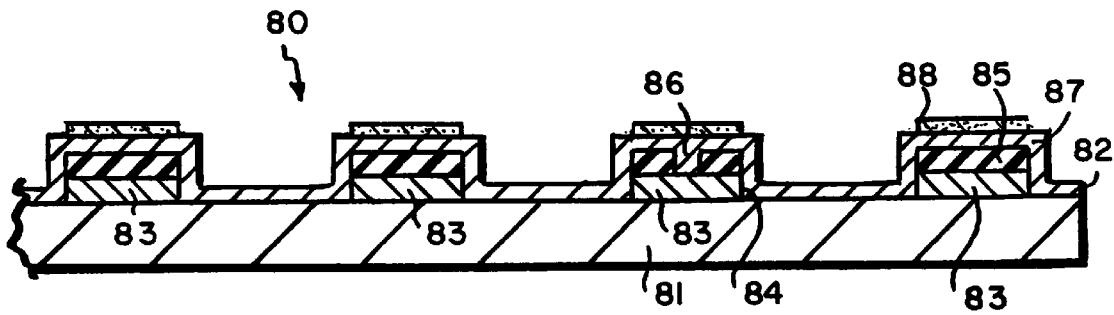
Figure 9:
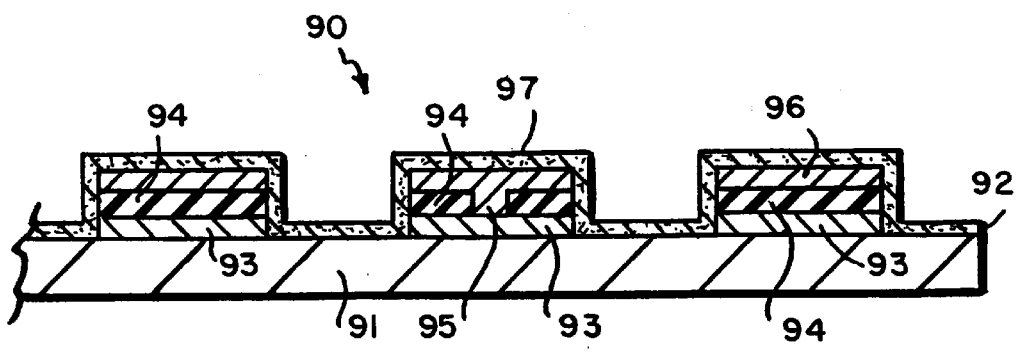

FIGS. 8 and 9 respectively show additional alternative embodiments of resonant tag labels 80 and 90 in accordance with the present invention. Resonant tag label 80 includes a carrier film 81 having at least one releasable surface 82 on which is applied a patterned electrically conductive layer 83. The conductive layer 83 may be continuously applied and thereafter selectively demetallized to leave gaps 84 so as to provide the resonant circuit configuration. It will be appreciated that the patterned conductive layer 83 may also be provided through patterned metallization coating of the releasable surface 82, or other conventional metallization patterning techniques such as etching of a metallic foil, etc. Thereafter, a dielectric coating 85 is applied in registered fashion so as to overlie only the patterned conductive layer 83. The dielectric coating 85 is also registered to include holes 86 to allow for the formation of the circuitry Thereafter, a second continuous electrically conductive layer 87 is applied to the structure and overlaps all surfaces including a connection to the first conductive layer 83 through the hole 86. Finally, a patterned adhesive layer 88 is applied in a registered manner to those areas which will be transferred to the desired receiving surface. Only those layers underlying the adhesive pattern will be transferred to the receiving surface, thus forming the circuitry of the resonant tag label as the carrier film is removed.

Figure 10:
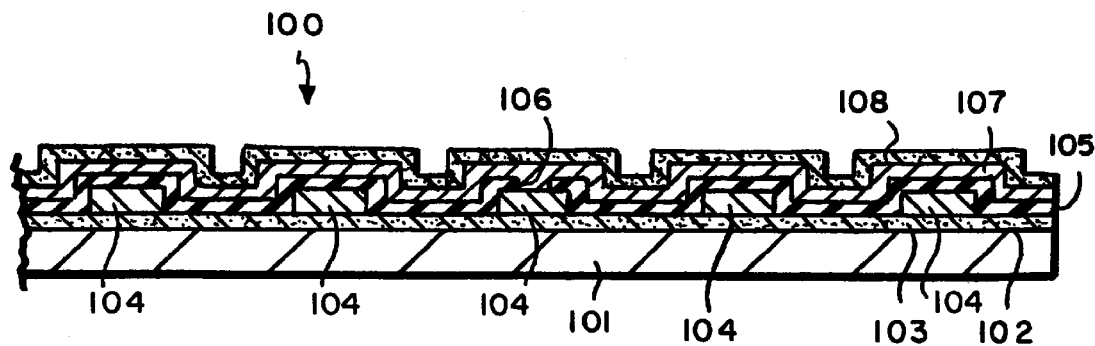

FIG. 9 shows a similar configuration of the resonant tag label 90 having a carrier film 91 with a release surface 92 on which is initially applied a first conductive pattern 93. A patterned dielectric coating 94 is applied to the conductive pattern 93 with registered holes 95. Thereafter, a second registered conductive pattern 96 is applied to overlie the dielectric coating. A connection between the first and second conductive patterns occurs via the registered hole 95. Finally, a continuous adhesive layer 97 is applied to overlie the entire surface of the label construction FIG. 10 shows a resonant tag label 100 as a further alternative embodiment of the present invention. The resonant tag label 100 includes a carrier film 101 having a release surface 102 on which is applied a continuous adhesive layer 103. The adhesive layer is preferably of the pressure-sensitive type. A first electrically conductive pattern 104 is applied to the adhesive with either a conventional registration technique or demetallization of a continuous coating. A dielectric layer 105 is applied to overlie the adhesive layer and the conductive pattern 102, and includes registered holes 106 for accommodating electrical connection to subsequent conductive layers. Thereafter, a continuous second electrically conductive layer 107 is applied to the structure, a portion of which contacts the conductive pattern 104 through the registered hole 106 in the dielectric layer. An optional second adhesive layer 108 can be applied to overlie the entire label structure.

The resonant tag label 100 is especially useful for applications in which the receiving surface includes its own adhesive coating, for example, the back of a previously coated pressure-sensitive label. In this configuration, the adhesive on the back of the substrate label acts as the bonding force to remove the circuit structure of the resonant tag label 100 from the carrier film 101. The resulting transfer of the resonant tag label will allow for the adhesive layer 103 to face in the same direction as the adhesive on the substrate label. Accordingly, this structure accommodates a more complete adhesive coverage to the back of the label, and for subsequent application of both the substrate label and the resonant tag label to a secondary receiving surface.

The utilization of the optional second adhesive layer 108 in the construction of the resonant tag label 100 is useful for application to a receiving surface which does not include an adhesive coating, yet subsequent to the transfer of the label 100, the adhesive layer 103 will be exposed for future bonding to any desired secondary receiving surface. In addition, depending on the severity of the environment of application, further dielectric coatings may be necessary to overlie the second conductive layer 107 or between the adhesive layer 102 and the remaining circuitry construction so as to add additional structural integrity, and/or protection against the harsh environment (thermal, shock, humidity chemical, etc.).

Figure 11:
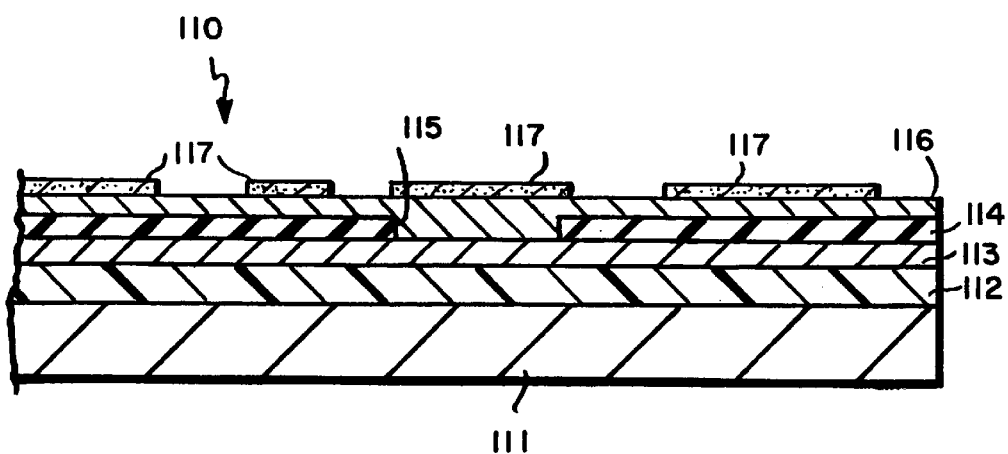

FIG. 11 shows a further alternative embodiment of a resonant tag label 110 in accordance with the present invention. The resonant tag label 110 includes a carrier film 111 with a continuous breakcoating 112 applied to one surface thereof. A continuous first electrically conductive layer 113 is applied to the breakcoating 112 either by selective metallization or application of a conductive ink. A dielectric layer 114 is applied to the conductive layer 113 with a registered hole 115. A continuous second electrically conductive layer 116 is then applied to the dielectric layer, and contacts the first conductive layer 113 through the registered hole 115. Thereafter, a selected adhesive pattern 117 is applied to the second conductive layer. During application of the resonant tag label 110, the breakcoating 112 will release from the carrier film 111 in a pattern determined by the adhesive. Accordingly, only those layers underlying the adhesive are transferred to the desired receiving surface.

While heretofore the present invention has been described as a multi-layered structure forming a resonant tag circuit, it will be appreciated by those of skill in the art that the same construction technique can be used to form single layered resonant tags or either single or multi-layered circuits other than inductive capacitance resonating circuits. For example, the construction can include a single conductive layer which forms either resistance or capacitive properties used for applications in addition to that of a resonant tag system. The fabrication techniques described herein provide thin transferable circuit systems which can be used in almost any circuit configuration.

Figure 12:
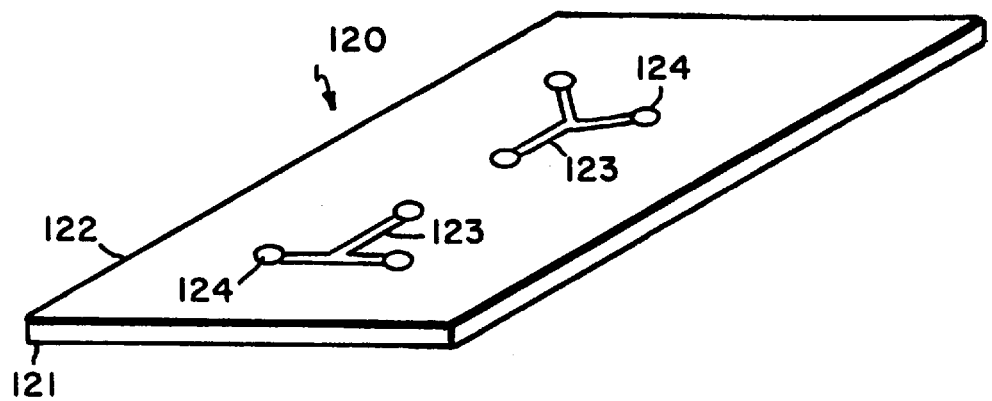
FIGS. 12A and 12B respectively show a perspective view and a cross-sectional view of an alternative embodiment of a thin film transferrable circuit in accordance with the present invention.
Figure 12:
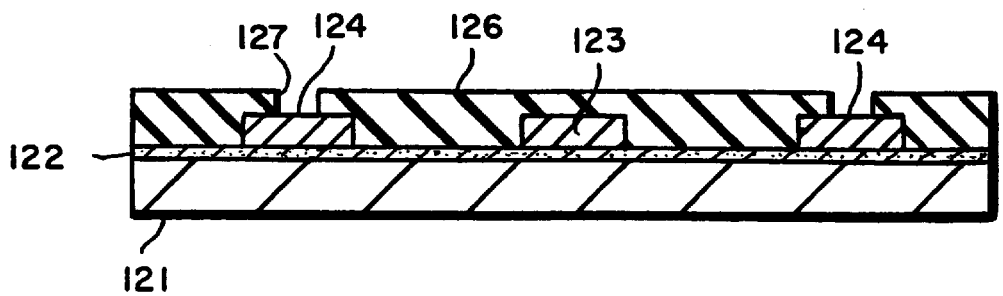

FIGS. 12A and 12B show an exemplary embodiment of a thin transferrable circuit system 120. As shown in FIG. 12A, the circuit system 120 includes a carrier film 121, with a release surface or breakcoating 122. As shown in FIG. 12B, a conductive pattern 123 forming a desired circuit is applied to the release surface 122. A dielectric layer 126 is applied in a registered manner so as to allow holes 127 which serve to expose a portion of the conductive pattern which are used as circuit contact points 124. Alternatively, an adhesive layer could replace the dielectric layer 126 in the construction.

Accordingly, the circuit system 120 is of a frangible construction and includes one conductive layer which is configured to define an electrical circuit. The label is transferrable from the carrier film onto a receiving surface and is otherwise inseparable from the carrier film without attendant disruption of the resonant tag circuit.

The advantages of such a circuit system include simplistic construction which includes only a single conductive layer or pattern, and a ready to transfer conductive structure which is readily registered to a specific location in an overall circuit design. More complex systems can be designed with multiple layers, each incorporating selective capacitance, resistance, or other such circuit elements through stacking of layer levels as previously described.

The foregoing description has been set forth to illustrate the invention and is not intended to be limited. Since modifications of the described embodiments incorporating the spirit and substance of the invention may occur to persons skilled in the art, the scope of the invention should be limited solely with reference to the appended claims and the equivalents thereof.

What is claimed is:

1. A method of labelling a receiving surface with a resonant tag label, said method comprising the steps of:

(a) providing a carrier substrate;
 (b) forming a frangible composite structure on said carrier substrate, said composite structure having first and second electrically conductive layers at least partially separated by a dielectric layer, said composite structure being at least partially transferable from said carrier substrate onto the receiving surface to form the resonant tag label; and
 (c) providing an adhesive arranged to coact with said frangible composite structure for applying at least a portion of said frangible composite structure to the receiving surface, said carrier substrate being separable from at least a portion of said frangible composite structure to provide an operable resonant circuit on said receiving surface, said composite structure being otherwise inseparable from said carrier substrate without attendant disruption of said resonant circuit.

2. A method of producing a resonant tag label, said method comprising the steps of:

providing a carrier film;
 depositing a first electrically conductive layer on said carrier film;
 depositing a dielectric layer on and at least partially covering said first electrically conductive layer;
 depositing a second electrically conductive layer on and at least partially covering said dielectric layer to provide a composite label structure, said label structure having oppositely facing sides, with said carrier film being integrally associated with first portions of said label structure and separably associated with second portions of said label structure at one of said sides; and
 applying an adhesive to at least a portion of said second electrically conductive layer, said adhesive being arranged to coact with the other side of label structure for applying said label structure to a receiving surface, said carrier film being separable from said second portions of the thus applied label structure with said first portions of said label structure remaining with said carrier film, said second portions defining an operable resonant circuit.

3. A method of producing a resonant tag label, said method comprising the steps of:

providing a carrier film;
 depositing a first electrically conductive layer on said carrier film;
 depositing a dielectric layer on and at least partially covering said first electrically conductive layer;
 depositing a second electrically conductive layer on and at least partially covering said dielectric layer to provide a composite label structure, said label structure having oppositely facing sides, with said carrier film being integrally associated with first portions of said label structure and separably associated with second portions of said label structure at one of said sides;
 adhering said label structure to a receiving surface; and
 separating said second portions of the thus applied label structure from said carrier substrate with said first portions of said label structure remaining with said carrier film, said second portions defining an operable circuit.

4. A method of producing a resonant tag label, said method comprising the steps of:

(a) applying a first electrically conductive pattern to a carrier substrate;
 (b) applying a first dielectric layer to at least said first electrically conductive pattern;

(c) applying a second electrically conductive pattern to said first dielectric layer, said first and second electrically conductive patterns forming a frequency tuned antenna circuit, said first dielectric layer and said first and second electrically conductive patterns defining a frangible composite structure that is transferable from said carrier substrate onto a receiving surface to form said label structure; and (d) applying a second dielectric layer to at least said second electrically conductive pattern, wherein the total thickness of said composite structure is in the range of about 0.025 mils to about 2.2 mils.

5. The method of claim 4, wherein said carrier substrate comprises a release material on a surface thereof adjacent said first electrically conductive pattern.

6. The method of claim 4, wherein said carrier substrate comprises a breakcoat material on a surface thereof adjacent said first electrically conductive pattern.

7. The method of claim 6, wherein said second dielectric layer comprises an adhesive layer being bondable to a substrate and having a peel strength greater than that required to separate said carrier substrate from the said composite structure.

8. The method of claim 4 further comprising the steps of:
applying an adhesive layer to said second dielectric layer; and
applying a carrier film to said adhesive layer.

9. The method of claim 4 further comprising the steps of adhering a third electrically conductive pattern to said second dielectric layer to form said frangible composite structure, said second and third electrically conductive patterns forming a second frequency tuned antenna circuit.

10. The method of claim 4 further comprising the steps of alternately adhering additional electrically conductive patterns and dielectric coatings, respectively, to said second dielectric layer to form said frangible composite structure in a stacked construction so as to form a plurality of additional frequency tuned antenna circuits.

11. The method of claim 4 further comprising the steps of repeating said steps (b) through (d) on portions of said first dielectric layer proximate to said first frequency tuned antenna circuit in a planar construction so as to form additional frequency tuned antenna circuits within said frangible composite structure.

12. The method of claim 4 further comprising the step of defining a gap in said first dielectric layer so as to allow a direct contact between said first and second electrically conductive patterns.

13. The method of claim 4, wherein said steps of applying said first and second electrically conductive patterns further comprise registered metal deposition of said patterns.

14. The method of claim 4, wherein said steps of applying said first and second electrically conductive patterns further comprise metal deposition and a subsequent demetallization of predetermined portions of deposited metal so as to obtain said patterns.

15. The method of claim 4, wherein said first antenna pattern comprises an electrically conductive plate.

16. The method of claim 15, wherein said second antenna pattern comprises a tuned frequency antenna.

17. The method of claim 4, wherein said first antenna pattern comprises a pair of electrically conductive plates.

18. The method of claim 17, wherein said second antenna pattern comprises a tuned frequency antenna.

19. The method of claim 18, wherein said first and second antenna patterns are inductively coupled to one another.

20. The method of claim 4 further comprising the step of providing plasma depositions of glass to envelop said first and second electrically conductive patterns.

21. A method of labelling a receiving surface with a resonant tag label, said method comprising the steps of:

(a) providing a carrier substrate; and (b) forming a frangible composite structure on said carrier substrate, said composite structure having first and second electrically conductive layers at least partially separated by a dielectric layer and having a thickness in the range of about 0.025 to 2.2 mils, said composite structure being partially transferable from said carrier substrate onto a receiving surface to form the resonant tag label, wherein said composite structure is integrally associated with first portions of said carrier substrate and separably associated with second portions of said carrier substrate.

22. A method of labelling a receiving surface with a resonant tag label, said method comprising the steps of:

(a) providing a carrier substrate; and (b) forming a frangible composite structure on said carrier substrate, said composite structure having first and second electrically conductive layers at least partially separated by a dielectric layer and having a thickness in the range of about 0.025 to 2.2 mils, said composite structure being at least partially transferable from said carrier substrate onto a receiving surface to form the resonant tag label, wherein said dielectric layer is formed as a deposit to a thickness in the range of about 0.025 to 1.2 mils.

23. A method of labelling a receiving surface with a resonant tag label, said method comprising the steps of:

(a) providing a carrier substrate; and (b) forming a frangible composite structure on said carrier substrate, said composite structure having first and second electrically conductive layers at least partially separated by a dielectric layer and having a thickness in the range of about 0.025 to 2.2 mils, said composite structure being at least partially transferable from said carrier substrate onto a receiving surface to form the resonant tag label, wherein said dielectric layer is a polymeric material.

24. A method of labelling a receiving surface with a resonant tag label, said method comprising the steps of:

(a) providing a carrier substrate, and (b) forming a frangible composite structure on said carrier substrate, said composite structure having first and second electrically conductive layers at least partially separated by a dielectric layer and having a thickness in the range of about 0.025 to 2.2 mils, said composite structure being at least partially transferable from said carrier substrate onto a receiving surface to form the resonant tag label, wherein said dielectric layer is discontinuous.

25. The method of labelling a receiving surface with a resonant tag label, said method comprising the steps of:

(a) providing a carrier substrate;

(b) forming a frangible composite structure on said carrier substrate, said composite structure having first and second electrically conductive layers at least partially separated by a dielectric layer and having a thickness in the range of about 0.025 to 2.2 mils, said composite structure being at least partially transferable from said carrier substrate onto a receiving surface to form the resonant tag label; and (c) separating at least first portions of said composite structure from second portions of said composite substrate.

26. A method of labelling a receiving surface with a resonant tag label, said method comprising the steps of:

(a) providing a carrier substrate;

(b) forming a frangible composite structure on said carrier substrate, said composite structure including a dielectric layer interposed between two electrically conductive layers and having a thickness in the range of about 0.05 to 2.2 mils, said composite structure being at least partially transferable from said carrier substrate onto a receiving surface to form the resonant tag, wherein said dielectric layer is formed as a deposit to a thickness in the range of about 0.05 to 1.2 mils;

(c) adhering said composite structure to the receiving surface; and (d) separating said carrier substrate from the thus adhered composite structure wherein at least a portion of said composite structure remains with the receiving surface in the form of a resonant tag label.

* * * * *